United States Patent
Kawamura et al.

(10) Patent No.: US 10,361,714 B2
(45) Date of Patent: Jul. 23, 2019

(54) READING AND WRITING COMPRESSED DATA USING LONG-TERM STORAGE

(71) Applicant: International Business Machines Corporation, Armonk, NY (US)

(72) Inventors: Kousei Kawamura, Tokyo (JP); Koichi Masuda, Tokyo (JP); Sosuke Matsui, Yokohama (JP); Yutaka Oishi, Kawasaki (JP); Takahiro Tsuda, Tokyo (JP)

(73) Assignee: International Business Machines Corporation, Armonk, NY (US)

( * ) Notice: Subject to any disclaimer, the term of this patent is extended or adjusted under 35 U.S.C. 154(b) by 253 days.

(21) Appl. No.: 14/970,677

(22) Filed: Dec. 16, 2015

(65) Prior Publication Data

US 2017/0179978 A1 Jun. 22, 2017

(51) Int. Cl.
*G06F 21/00* (2013.01)
*H03M 7/30* (2006.01)
*G06F 16/178* (2019.01)

(52) U.S. Cl.
CPC .......... *H03M 7/60* (2013.01); *G06F 16/1794* (2019.01); *H03M 7/30* (2013.01); *H03M 7/6041* (2013.01)

(58) Field of Classification Search
CPC .......... H03M 7/60; G06F 17/30091; G06F 12/1408; G06F 17/30179; G06F 2212/1052
See application file for complete search history.

(56) References Cited

U.S. PATENT DOCUMENTS

| | | | | |
|---|---|---|---|---|
| 6,121,903 A | * | 9/2000 | Kalkstein | H03M 7/3086 341/106 |
| 9,048,862 B2 | * | 6/2015 | Condict | H03M 7/607 |
| 9,641,378 B1 | * | 5/2017 | Steffen | G06F 3/0638 |
| 2006/0275022 A1 | * | 12/2006 | Perlman | H04N 19/61 386/328 |
| 2007/0168564 A1 | * | 7/2007 | Conley | G06F 12/0866 710/1 |
| 2011/0320910 A1 | * | 12/2011 | Liu | G06F 11/10 714/758 |
| 2012/0260009 A1 | * | 10/2012 | Lu | G06F 3/0608 710/52 |
| 2015/0100553 A1 | * | 4/2015 | Fabijancic | G06F 17/30073 707/673 |
| 2015/0254141 A1 | * | 9/2015 | Wertheimer | G06F 16/22 707/646 |
| 2015/0286467 A1 | * | 10/2015 | Khan | G06F 5/12 710/310 |

\* cited by examiner

*Primary Examiner* — John B King
*Assistant Examiner* — Darshan I Dhruv
(74) *Attorney, Agent, or Firm* — Nolan M. Lawrence

(57) ABSTRACT

A storage system receives one or more records from a host system. The records are compressed in a first compression format that is native to the host system. The storage system identifies an incompatibility between the first compression format and a first operation of the storage system. In response to the identified incompatibility, the storage system decompresses the received records. The decompression is based on the first compression format. The storage system compresses the decompressed records in a second compression format. The storage system stores the secondarily compressed records onto a storage medium.

20 Claims, 4 Drawing Sheets

US 10,361,714 B2

READING AND WRITING COMPRESSED DATA USING LONG-TERM STORAGE

BACKGROUND

The present disclosure relates to long-term storage, and more specifically, to utilizing multiple compression algorithms in long-term storage devices.

Long-term storage may enable computer systems to store large amounts of data safely and cost effectively. Commercial industries may utilize long-term storage to retain larger amounts of data that enhance profitability. Healthcare industries may utilize long-term storage to capture and store a more comprehensive amount of patient-related data. Governments may utilize long-term storage to store more detailed records about their citizens. Private individuals may utilize long-term storage to backup pictures and videos to prevent against loss of data.

SUMMARY

Embodiments of the present disclosure include a method, system, and computer program product for storing data on a storage medium. A storage system receives one or more records from a host system. The records are compressed in a first compression format that is native to the host system. The storage system identifies an incompatibility between the first compression format and a first operation of the storage system. In response to the identified incompatibility, the storage system decompresses the received records. The decompression is based on the first compression format. The storage system compresses the decompressed records in a second compression format. The storage system stores the secondarily compressed records onto the storage medium.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
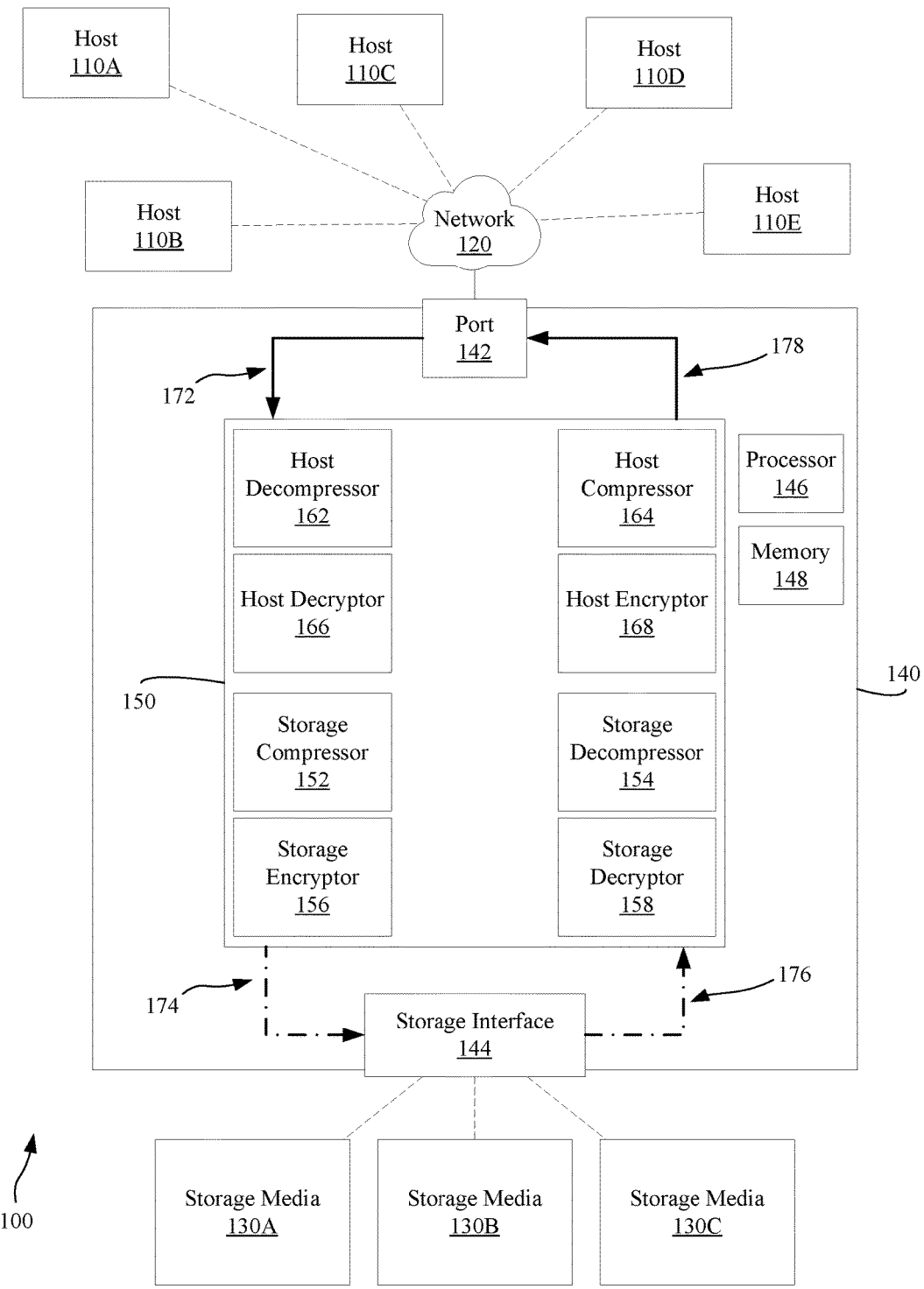
FIG. 1 depicts a computing environment for long-term storage of records by a host aware long-term storage system in accordance with embodiments of the present disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to long-term storage devices, more particular aspects relate to utilizing multiple compression algorithms in long-term storage devices. While the present disclosure is not necessarily limited to such applications, various aspects of the disclosure may be appreciated through a discussion of various examples using this context.

While utilized to perform a variety of tasks, computer systems (computers) may be required to provide ever increasing capabilities. These computers may utilize one or more algorithms to increase performance and capability. These computers may be similar to the example computer depicted in FIG. 4 of the present disclosure.

One such algorithm may be a compression algorithm that provides a computer with increased storage capacity and efficiency. The compression algorithm may compress and decompress one or more files on the computer as needed. The compression algorithm may be optimized for the capabilities of the computer such as the available processor and memory. The selection of a compression algorithm may also take into account capabilities of software (e.g., operating systems or applications) running on the computer, such as the ability of the software to read files while in a compressed state. The selection of a compression algorithm may also take into account the present state of the computer, such as the tasks being performed or the activity of a user of the computer.

Another such algorithm may be an encryption algorithm that provides increased security and privacy for a computer. The encryption algorithm may encrypt or decrypt one or more files on the computer. The encryption algorithm may operate based on the hardware of the computer such as the available processor and memory. The encryption algorithm may be optimized for the hardware and may operate based on other software running on the computer. Selection of the encryption algorithm to be used may take into account factors such as the requisite level of security or the tolerable level of latency to for encryption.

Long-term storage systems (LSS) may provide the computer with additional storage of records from the computer. The records may include the files, folders, or application states of software of the computer. The LSS may enable a computer system to store data for long periods of time. The LSS may enable the stored data to be transported offsite to deal with severe weather scenarios (e.g., storms, earthquakes, etc.). The LSS may also provide data resiliency as one or more files are redundantly stored on both storage of the computer system and also the LSS. The LSS may provide a computer with the ability to pause a first software application into an application state and store the application state. The stored application state may allow the computer to reallocate its resources to a second software application and later resume operation of the first software application.

The LSS may utilize a storage compression algorithm to enable the LSS to store additional files. The storage compression algorithm may be designed to operate at an increased efficiency in comparison to the compression algorithm performed by the computer. The increased efficiency may be of the compression ratio of the compression algorithm or another capability (e.g., readability of records while in a compressed state, search speed of compressed records, data integrity of compressed records, etc.). The LSS may include a variety of components, such as hardware, software, or firmware. The components may be customized for increased performance while working with the storage compression algorithm.

Likewise the LSS may also utilize a storage encryption algorithm to enable the LSS to secure the stored files. The storage encryption algorithm may be designed to operate at an increased efficiency in comparison to the encryption algorithm of the computer. The increased efficiency may regard the level of security, the length of time records are likely to be stored, the media of storage, etc. The components of the LSS may also be customized for increased performance while working with the storage encryption algorithm.

A host aware long-term storage system (HALS) may translate between host-based compression algorithms (HC) and storage-based compression algorithms (SC) while storing records for one or more hosts. The HALS may also translate between host-based encryption algorithms (HE) and storage-based encryption algorithms (SE). The hosts may be one or more computers or computing like systems that may require long-term storage, such as tablets, smartphones, cloud-computing environments, etc. The HALS may enable hosts to use HC and HE on records while also storing these records with SC and SE. The HALS may provide enhanced performance for interfacing with long-term storage even when a host is using HC and HE.

FIG. 1 depicts a computing environment 100 for long-term storage of records by a HALS in accordance with embodiments of the present disclosure. The computing environment 100 may include the following: a plurality of host computing systems 110A, 110B, 110C, 110D, and 110E (collectively, 110); a network 120 for communicatively coupling the components of the computing environment; one or more storage media 130A, 130B, and 130C (collectively, 130) for storing records; and a storage device 140 for interfacing with the storage media 130.

The hosts 110 may be computer systems, such as laptops, smartphones, and tablets. Each of the hosts 110 may be a general purpose computer comprised of hardware. An example computer may be depicted in FIG. 4. Each host 110 may execute an operating system or hypervisor that directs operation of the hardware. The operating system may execute, in conjunction with the hardware, one or more software programs and may create or manipulate files and folders. The execution software programs may be paused into a software state. The software states, files, and folders may be collectively referred to as records. In some embodiments, the hosts 110 may be nodes of a single physical computer.

The hosts 110 may try to optimize storage space of one or more secondary storage devices (e.g., hard drives, solid state drives, etc.) contained with the hosts. In some embodiments, the hosts 110 may try to optimize storage space of one or more primary storage devices (e.g., cache or ram) of the hosts. The effectiveness of this optimization may be depend on a compression algorithm (HC) used. The HC may be executed by a given host 110 through a processing component of the host. The HC may be selected to provide a high level of performance to the host 110 during execution of the operating system and other software applications. The HC may compress a specific file or set of files, such as in image or audio compression. The HC may compress a large subset of records, such as in a real-time file compression of a file-system. In embodiments where the compression is directed towards primary storage, the HC may be directed towards only the working set of records that are actively in memory. The HC may be selected or optimized for the particular software or hardware of the hosts 110.

The hosts 110 may also try to secure one or more records from unauthorized access. To prevent unauthorized access, the hosts may perform a particular encryption algorithm (HE). The HE may be executed by a processing component of a given host 110. The HE may be performed on a subset of records, such as when one or more files that are of a proprietary nature are secured. The HE may be selected based a number of factors, including, for example, based on whether a given host 110 is accessible to a wide-area network such as the Internet (e.g., a very computationally intensive algorithm may be required). The HE may be selected or optimized for the particular software or hardware of the hosts 110.

The network 120 may be a wired network utilizing one or more wireless standards (e.g., Ethernet). The network 120 may also be a wireless network. The network 120 may connect the hosts 110 to each other. The network 120 may also connect to an external network (e.g., the Internet). The network 120 may also be a serial or parallel network or a network specifically designed to connect hosts 110 to a storage device 140 (e.g., a storage area network). Each of the storage media 130 may store records from one or more hosts 110. The storage media 130 may be disks such as rotational magnetic media discs (hard disks). The storage media 130 may also be any other type of storage, such as flash memory, a solid state drive, or magnetic tape.

The storage device 140 may be a computing device designed to facilitate tertiary storage or long-term storage of records of the hosts 110 within the storage media 130. The storage device 140 may include the following components: a network port 142; a storage interface 144; a processor 146, a memory 148; and a translator 150. The network port 142 may communicate with the network 120 to provide the hosts 110 with access to the storage device 140. The network 120 and the network port 142 may communicate using one or more known communication protocols. For example, the network 120 may be a packet-based network and the port 142 may communicate using a file-based access protocol. In some embodiments, the network 120 may use a block-based access protocol to communicate with the network port 142. The storage interface 144 may communicate with the storage media 130. The storage interface 144 may communicatively couple the other components of the storage device 140 to the storage media 130. The storage interface 144 may also provide enhanced performance or redundancy through communication with the storage media 130. For example, the storage media 130A, 130B, and 130C may be divided into a single logical partition (e.g., a redundant array of independent disks). Continuing the example, the storage interface 144 may communicate using a protocol to take advantage of the partitioning of the storage media 130. In some embodiments, the storage interface 144, may physically manipulate the storage media 130 as well as other storage media (not depicted) and may selectively couple with one or more storage media. For example, the storage interface 144 may be a carousel or a robotic arm or both, and the storage interface may permit the storage device 140 to engage and disengage with various media as requested by a given host 110.

The processor 146 may utilize the memory 148, and may direct the other components of the storage device 140. The processor 146 and the memory 148 may be firmware and may run various software operations embodied thereon. The processor 146 may receive updates from a host 110 or other entity (not depicted), such as an administrative user or hypervisor. The updates may provide the storage device 140 with bug-fixes or increased functionality. The processor 146 may receive one or more requests from the hosts 110 and may instruct the storage device 140 based on the requests. The requests may include write operations, read operations, search operations, delete operations, etc. The memory 148 may be temporary memory, e.g., random access memory, or may be non-volatile, such as flash-memory or a disk drive—or a combination of temporary and non-volatile memory.

The translator 150 may convert data from the hosts 110 to a compressed form for the storage media 130. The translator 150 may be one or more circuits that are designed to perform specific operations with high-levels of efficiency (e.g., an application specific integrated circuit). The translator 150 may be one or more circuits configured to perform a series of storage-specific compression and decompression algorithms (SC). The translator 150 may also be configured to perform a series of storage-specific encryption and decryption algorithms (SE). The translator 150 may include hardware-embodied operators including: a storage compressor 152, a storage decompressor 154, a storage encryptor 156, and a storage decryptor 158. These operators may enable received data to be quickly compressed and decompressed as well as encrypted and decrypted in response to instructions from the processor 146. The operators may be hard-coded into the translator 150 to increase performance (e.g., compression ratio, speed, encryption level, latency, reliability, etc.).

In some embodiments, the translator 150 may also be configured to perform a series of host-specific compression and decompression algorithms (HC). The HCs may be carried out by additional components—a host decompressor 162 and a host compressor 164. Additionally, the translator 150 may also be configured to perform a series of host-specific encryption and decryption algorithms (HE). The HEs may be carried out by additional components—a host decryptor 166 and host encryptor 168.

The host-specific algorithms may be hard-coded HCs and HEs embodied similarly to the other operators (e.g., the storage compressor 154). The hard-coded algorithms may provide the storage device 140 to operate with increased performance while manipulating records from hosts 110 that are encrypted or compressed using those algorithms. If a given host 110 uses an algorithm other than a hard-coded algorithm, compression or decompression may be routed to the processor 146. A significant performance degradation may occur if the processor 146 performs an HC or HE. In some embodiments, the additional components 162, 164, 166, and 168 may be configured to perform a variety of HCs and HEs. This configuration may be because the circuitry of the additional components may include various components that allow higher performance of the various HCs and HEs (e.g., increased parallelization, larger amounts of cache, hard-coded sub-operations common to a wide variety HCs and HEs, branch prediction, etc.). This configuration may be through a customizable set of circuitry that allows efficient performance of one or more algorithms (e.g., a field-programmable gate array).

In a first example usage scenario, the port 142 of the storage device 140 receives a batch of first records from host 110A through the network 120. The first records are encrypted with an HE specific to host 110A. The storage device 140 also receives a store-command from host 110A. The processor 146, in response to the store-command, scans the first records and identifies that the first records are encrypted with the HE specific to host 110A. The processor 146 records into memory 148 a compression/encryption preference. The compression/encryption preference indicates that host 110A sent records utilizing the HE specific to host 110A.

Continuing the first example usage scenario, the processor 146 directs the first records to the translator 150 (per operation 172) and instructs the host decryptor 166 to decrypt the HE specific to host 110A. The host decryptor 166 decrypts the first records and notifies the processor 146 of decryption. The processor 146 instructs, based on the notification, the storage compressor 152 to compress the first records utilizing an SC. After compression by the storage compressor 154 the processor 146 instructs the storage encryptor 156 to encrypt the first records utilizing an SE. After encryption by the storage encryptor 156 the processor directs the records to the storage interface 144 (per operation 174) along with a storage-address for the records. The storage interface 144 selects one of the storage media 130, based on the storage-address, and writes the records to the storage media.

In a second example usage scenario the storage device 140 receives a second record request from host 110C through the network 120. The second record request indicates a particular set of second records are desired by the host 110C. The second record request includes a second search string related to a character string of records that should be located on one of the storage media 130. The processor 146 stores the second search string in to the memory 148. The processor 146 also retrieves a compression/encryption preference from the memory 148 that indicates records from host 110C should be provided to host 110C compressed utilizing an HC. The processor 146 instructs the storage interface 144 (per operation 176), to retrieve records from the storage media 130 and direct them to the storage decompressor 154.

Upon receipt of compressed records from the storage interface 144, the storage decompressor 154 decompresses and provides the uncompressed records to the processor 146. The processor 146 compares the records from the storage decompressor 154 to the second search string received from the host 110C. If no matching records are found, the processor 146 repeats the instruction to the storage interface 144 (per operation 176) and waits for more records from the storage decompressor 154. If matching records are found, the processor 146 instructs the host compressor 164 to compress the matching records with the HC. Upon compression by the host compressor 164 the processor 146 directs the matching records (per operation 178) to the host 110C through the port 142.

Figure 2:
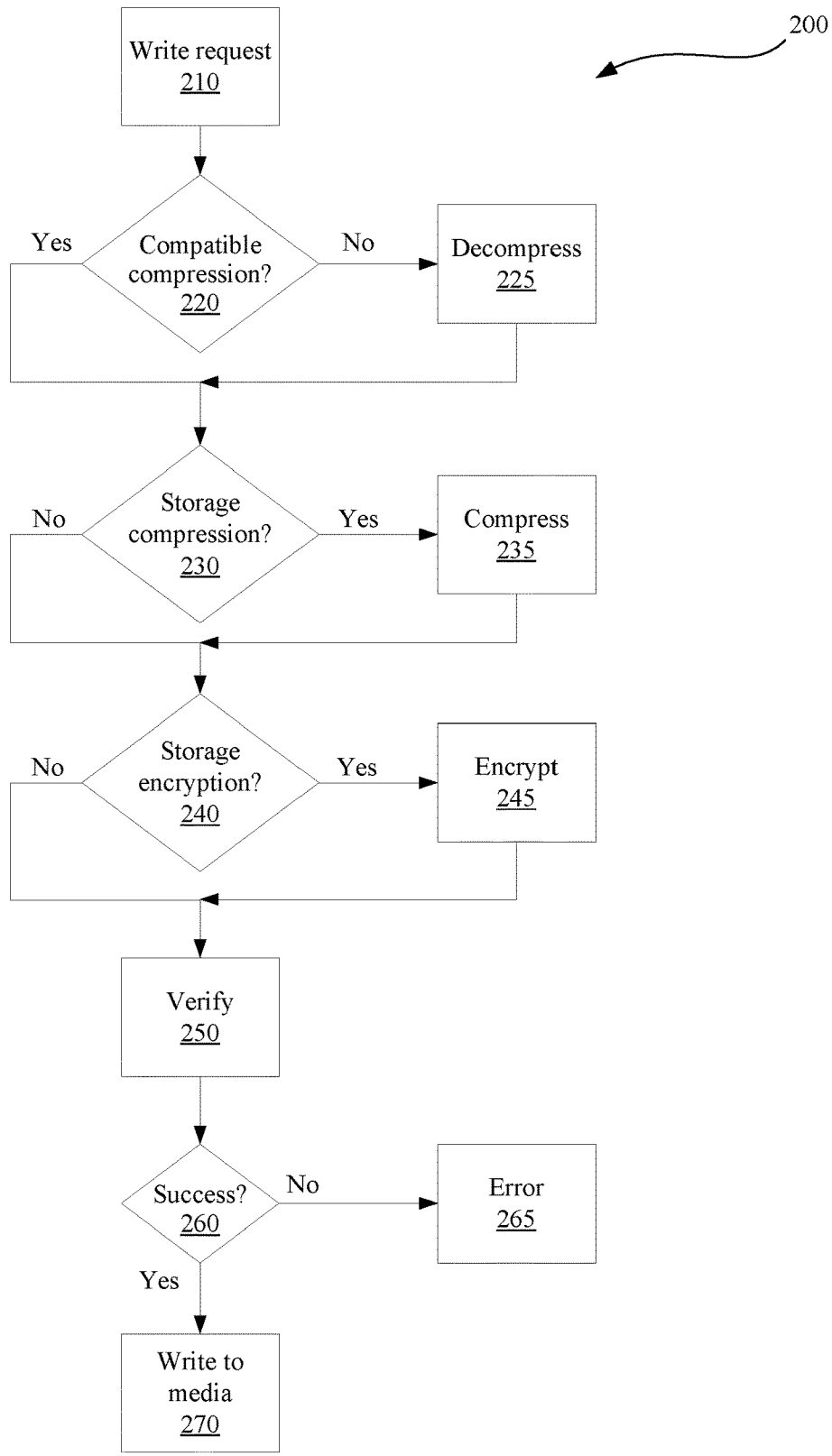
FIG. 2 depicts an example method for storing compressed files in accordance with embodiments of the present disclosure.

FIG. 2 depicts an example method 200 for storing compressed files in accordance with embodiments of the present disclosure. Method 200 may be performed by a HALS during operation in a computing environment. The HALS may be designed to interface with a plurality of hosts. The HALS may store and retrieve host data (in the form of records) to and from one or more storage media. The HALS may be equipped with one or more specialized circuits configured to perform the operations of method 200. The operations of method 200 may be performed in the order depicted, but may also be performed in another order. It should be appreciated that additional operations other than those depicted in method 200 may also be performed. Further, some operations of method 200 may be performed by the HALS alone or in combination with other hardware, software, or firmware. Method 200 may be a subset of a larger method that includes listening for requests from a host.

Method 200 may begin by receiving a request to write one or more records (per operation 210). The write request may include a command such as a store command. The write request received (per 210) may also include one or more records to be written. The write request and the records may be in an expected format understood by the HALS (e.g., a bit-stream, block-based data, packet-based data, etc.). The write request (per 210) may come from a host, such as a computer system communicatively coupled to the HALS through a network (e.g., wired or wireless) or bus (e.g., parallel or serial). The received records may be in a compressed state. The compressed state may from a host-specific compression algorithm (HC) applied by the host or another entity (e.g., a file the host received in the compressed state from the Internet).

It may be determined (per operation 220) if the HC is compatible with one or more operations of the HALS. The incompatibility may include a total-incompatibility, such as the inability of the HALS to view or index records based on the HC.

For example, a host may wish to perform a string search for a character string on a set of records (recordset). The host must first request and receive the entire recordset from the HALS, then write that recordset to a storage of the host, then begin the search procedure from the storage of the host. A host that wishes to retrieve records from the HALS and perform a search for a character string may instead utilize the HALS. The HALS may retrieve the search string from the host and may retrieve records one-by-one and utilize SC/SE to quickly decompress/decrypt a record and search for the string without first retrieving the entire dataset. If the recordset is compressed with an HC, however, the strings stored in the recordset may no longer be unique. The HC may utilize pattern matching (or another compression technique) to substitute a string or set of strings with another string. This substitution may eliminate or duplicate a string to be searched, preventing a string search from occurring.

The incompatibility may include a partial-incompatibility, such as a performance degradation due to the HC. For example, there are many compression algorithms that a host may select and use as an HC. The HALS may not have dedicated circuits to perform the selected HC, and may need to perform compression/decompression with a general processor of the HALS. The compression/decompression of an HC by a general processor may result in a slower experience.

If the HC is incompatible (per 220), the HALS may decompress the received records (per operation 225). The decompression (per 225) may be performed by a general purpose processor of the HALS. In some embodiments, the decompression (per 225) may be performed by one or more specialized circuits of the HALs.

If the HC is compatible (per 220) (alternatively, if the received records were decompressed per 225), the HALS may determine if the received records should be compressed prior to storage (per operation 230). The compression prior to storage may be a storage-specific compression algorithm (SC) applied by the HALS or one of its components. The SC may provide one or more benefits, such as high compression ratios or expedient decompression. If received records should be compressed (per 230), the HALS may compress the received records (per operation 235). If the HALS decides not to compress the received records (per 230) (alternatively, if the received records were compressed per 235), the HALs may determine if the received records should be encrypted prior to storage (per operation 240). The encryption prior to storage may be a storage-specific encryption algorithm (SE) applied by the HALS or an associated component. The SE may provide one or more benefits, such as enhanced security or reduced bit rot. If received records should be encrypted (per 240), the HALS may encrypt the received records (per operation 245).

Per operation 250 and if HALS decides not to encrypt the received records (per 240) (alternatively, if the received records are encrypted per 245), any compression (per 235) and/or encryption (per 245) may be verified. The compression/encryption verification (per 250) may be performed before any writing of records to a media, to prevent data loss or corruption. The HALS may verify compression (per 250) by utilizing the SC to decompress a subset of the received records that were compressed (per 235). The HALS may further verify compression (per 250) by comparing the decompressed subset to the records received (per 210). If the received records were decompressed (per 225), the HALS may further verify compression (per 250) by comparing the decompressed subset to the decompressed records. The HALS may verify encryption (per 250) by utilizing the SE to decrypt a subset of the received records that were encrypted (per 245). The HALS may further verify encryption (per 250) by comparing the decrypted subset to the records received (per 210). If the received records were decompressed (per 225), the HALS may further verify the encryption (per 250) by comparing the decrypted subset to the decompressed records.

If the verification (per 250) is successful (per operation 260), the HALS may write the received records to a media (per operation 270), such as one or more magnetic tape cassettes. The HALS may also record along with the write to media (per 270) one or more attributes regarding the written record to a memory component. The attributes may include the following: information regarding the write status; the particular cassette or cassettes used; whether HC, SC, or SE was utilized, and preferences a host may have regarding the written records. After writing the records to the medium (per 270), method 200 may end and the HALS may continue listening for requests. In some embodiments, after writing records to the medium (per 270) the HALS may notify the host of a successful operation.

If the verification (per 250) is unsuccessful (per 260), the HALS may provide an error (per operation 265). The error (per 265) may be provided to the host that sent the write request. The error (per 265) may be provided to an administrator (e.g., a user or administrative system) of the HALS. The error (per 265) may include the received record or an identifier thereof. The error (per 265) may prevent the HALS from writing records to a media that are incorrectly compressed/encrypted/read from the host. The method 200 may end after providing the error (per 265), and the HALS may continue listening for requests. In some embodiments, the HALS may enter a paused state after providing the error (per 265), where no further requests may be acknowledged or may only be acknowledged by returning an error state.

Figure 3:
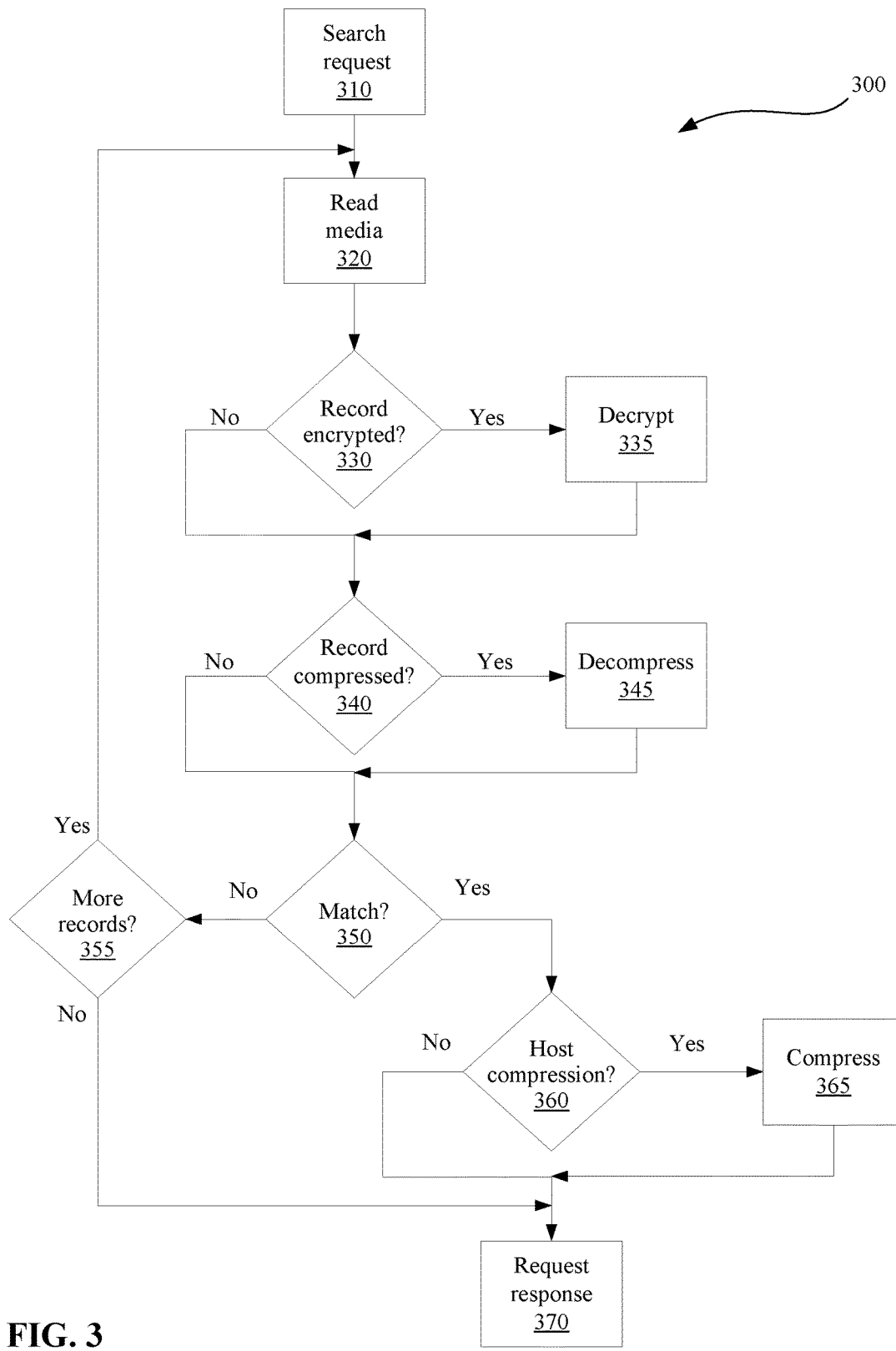
FIG. 3 depicts an example method for searching for records in accordance with embodiments of the present disclosure.

FIG. 3 depicts an example method 300 for searching for records in accordance with embodiments of the present disclosure. Method 300 may be performed by a HALS during operation in a computing environment. The HALS may be designed to interface with a plurality of hosts. The HALS may store and retrieve host data (in the form of records) to and from one or more storage media. The HALS may be equipped with one or more specialized circuits configured to perform the operations of method 300. The operations of method 300 may be performed in the order depicted, but may also be performed in another order. It should be appreciated that additional operations other than those depicted in method 300 may also be performed. Further, some operations of method 300 may be performed by the HALS alone or in combination with other hardware, software, or firmware. Method 300 may be a subset of a larger method that includes listening for requests from a host.

Method 300 may begin by receiving a request to search for one or more records (per operation 310) stored upon a media communicatively coupled to the HALS. The search request may include a search value (e.g., a string of characters, a specific number, a particular image, etc.). The search request may also include a search identifier (e.g., a unique token related only to the search value). The search request may come from a host, such as a computer system communicatively coupled to the HALS through a network or bus. The HALS may have performed operations for the host before receiving the search request and may have saved one or more attributes to memory regarding the prior operations.

Per operation 320, the HALS may read a media for the records requested (per 310). The HALS may read the media (per 320) by issuing commands to interface with the media, such as to mechanically select a given media from a plurality (e.g., utilizing a carousel or magazine holding a plurality of tapes and physically engaging the tapes). The HALS may further read the media (per 320) by communicatively scanning through the media after mechanical selection to read the data stored thereon. The HALS may utilize the search value to read the media (per 320). The HALS may utilize the saved attributes to read the media (per 320).

Records that have been retrieved by the read media operation (per 320) may be have been encrypted (e.g., using an SE or HE). The HALS may determine (per operation 330) that the retrieved records may be encrypted. The HALS may determine (per 330) that a given retrieved record is encrypted by utilizing the saved attributes. The HALS may determine (per 330) that a given retrieved records is encrypted by scanning the given retrieved record (e.g., by identifying a bit-pattern of the record indicative of an SE). If a record is determined encrypted (per 330), the HALs may decrypt the retrieved records (per 335). The HALS may decrypt the retrieved records (per 355) by utilizing an application specific integrated circuit (circuit). The circuit may have an algorithm embodied therein such as an SE that may enable efficient encryption and decryption.

Records that have been retrieved by the read media operation (per 320) may have been compressed (e.g., using an SC or HC). After determining a given retrieved record is not encrypted (per 330) (alternatively, after decrypting a given retrieved record per 335), the HALS may determine that the retrieved record may be compressed (per operation 340). The HALS may determine (per 340) that a given retrieved record is compressed by utilizing the saved attributes. The HALS may determine (per 340) that a given retrieved records is compressed by scanning the given retrieved record (e.g., by identifying a bit-pattern of the record indicative of an SC). If a record is determined compressed (per 340), the HALs may decompress the retrieved records (per 345). The HALS may decompress the retrieved records (per 345) by utilizing the circuit.

After determining a given retrieved record is not compressed (per 340) (alternatively, after decompressing a given retrieved record per 345), the HALS may determine if a given retrieved record is a match (per operation 350). The HALS may determine (per 350) a match by comparing the retrieved record search value provided by the host. If the record is not a match (per 350), the HALS may determine if there are more records to search (per operation 355). If there are more records (per 355), the HALS may again read the media (per 320) for additional records.

If the record is a match (per 350), the HALS may determine if the host that requested the search prefers that the matched records are compressed (per operation 360). The HALS may determine that the host prefers compression (per 360) based on the saved attributes. In some embodiments, the search request received (per 310) may include a preference regarding compression. The HALS may use the preference indicated in the search request to determine that the host prefers compression (per 360). The HALS may determine that the host prefers compression (per 360) based on a previous request that the host provided to the HALS. The HALS may determine that the host prefers compression (per 36) based on previous requests from other hosts that are of a similar configuration or that perform a similar task to the host. If it is determined that the HALS prefers compression (per 360), the HALS may compress the matched records (per 365) using the circuit. The HALS may compress the matched records (per 365) using an HC native to the host.

Per operation 370, the HALS may respond to the request if there are no more records to be read from the media (per 355) (alternatively, if the host does not prefer compression per 360) (alternatively still, after the matched records are compressed). The response (per 370) may include the names and locations of the media that were searched (e.g., "Tape media located in lower carousel searched."). The response (per 370) may include the records themselves in the requested format. The response may include a statement as to the lack of a match to the search request (per 350) if there were no more records to read (per 355) (e.g., "No records matching search value were found, please verify search value and try again."). After the request response has been provided (per 370) method 300 may end.

Figure 4:
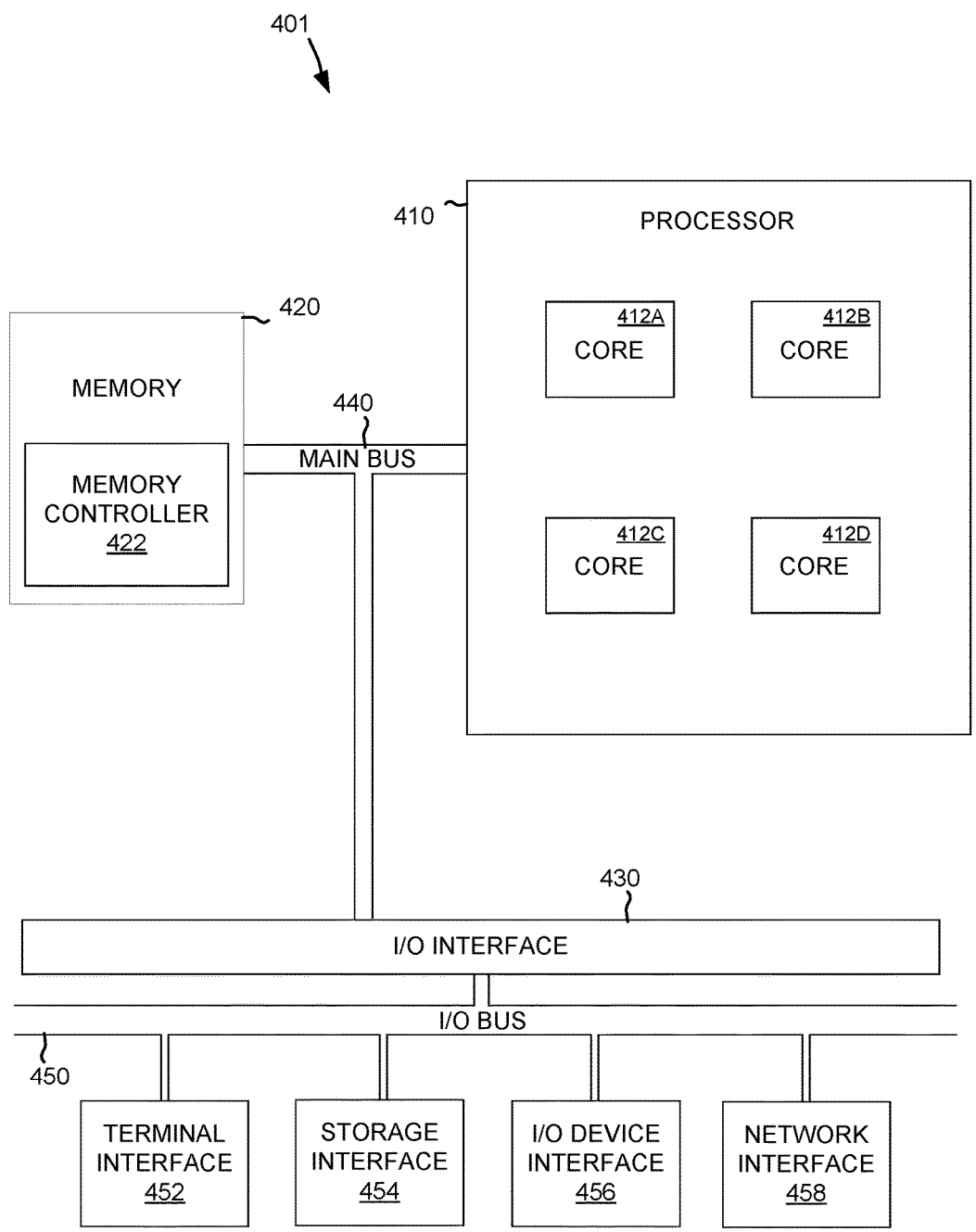
FIG. 4 depicts the representative major components of an example computer system 401 that may be used, in accordance with embodiments of the present disclosure.

FIG. 4 depicts the representative major components of an example computer system 401 that may be used, in accordance with embodiments of the present disclosure. It is appreciated that individual components may vary in complexity, number, type, and\or configuration. The particular examples disclosed are for example purposes only and are not necessarily the only such variations. The computer system 401 may comprise a processor 410, memory 420, an input/output interface (herein I/O or I/O interface) 430, and a main bus 440. The main bus 440 may provide communication pathways for the other components of the computer system 401. In some embodiments, the main bus 440 may connect to other components such as a specialized digital signal processor (not depicted).

The processor 410 of the computer system 401 may be comprised of one or more cores 412A, 412B, 412C, 412D (collectively 412). The processor 410 may additionally include one or more memory buffers or caches (not depicted) that provide temporary storage of instructions and data for the cores 412. The cores 412 may perform instructions on input provided from the caches or from the memory 420 and output the result to caches or the memory. The cores 412 may be comprised of one or more circuits configured to perform one or methods consistent with embodiments of the present disclosure. In some embodiments, the computer system 401 may contain multiple processors 410. In some embodiments, the computer system 401 may be a single processor 410 with a singular core 412.

The memory 420 of the computer system 401 may include a memory controller 422. In some embodiments, the memory 420 may comprise a random-access semiconductor memory, storage device, or storage medium (either volatile or non-volatile) for storing data and programs. In some embodiments, the memory may be in the form of modules (e.g., dual in-line memory modules). The memory controller 422 may communicate with the processor 410, facilitating storage and retrieval of information in the memory 420. The memory controller 422 may communicate with the I/O interface 430, facilitating storage and retrieval of input or output in the memory 420.

The I/O interface 430 may comprise an I/O bus 450, a terminal interface 452, a storage interface 454, an I/O device interface 456, and a network interface 458. The I/O interface 430 may connect the main bus 440 to the I/O bus 450. The I/O interface 430 may direct instructions and data from the processor 410 and memory 420 to the various interfaces of the I/O bus 450. The I/O interface 430 may also direct instructions and data from the various interfaces of the I/O bus 450 to the processor 410 and memory 420. The various interfaces may include the terminal interface 452, the storage interface 454, the I/O device interface 456, and the network interface 458. In some embodiments, the various interfaces may include a subset of the aforementioned interfaces (e.g., an embedded computer system in an industrial application may not include the terminal interface 452 and the storage interface 454).

Logic modules throughout the computer system 401—including but not limited to the memory 420, the processor 410, and the I/O interface 430—may communicate failures and changes to one or more components to a hypervisor or operating system (not depicted). The hypervisor or the operating system may allocate the various resources available in the computer system 401 and track the location of data in memory 420 and of processes assigned to various cores 412. In embodiments that combine or rearrange elements, aspects and capabilities of the logic modules may be combined or redistributed. These variations would be apparent to one skilled in the art.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A method of storing data on a storage medium, the method comprising:
receiving, by a storage system, one or more records from a host system, the records compressed in a first compression format native to the host system, wherein the storage system is a host-aware long-term storage system;
identifying, by the storage system, an incompatibility between the first compression format and a first operation of the storage system, wherein the incompatibility is the storage system is unable to index the one or more records to write them to the storage medium;
decompressing, by the storage system and before writing to the storage medium, based on the first compression format, and in response to the identified incompatibility, the received records;
compressing, by the storage system and before writing to the storage medium and in a second compression format, the decompressed records; and
storing, by the storage system and after the decompressing and after the compressing, the secondarily compressed records onto the storage medium.

2. The method of claim 1 further comprising:
receiving, by the storage system, a request for the secondarily compressed records;
retrieving, by the storage system, the secondarily compressed records from the storage medium;
decompressing, by the storage system and based on the second compression format, the secondarily compressed records; and
providing, by the storage system, the requested records.

3. The method of claim 2, wherein the requested records are re-compressed in the first compression format.

4. The method of claim 1, wherein the storage system is a tape drive, and wherein the storage medium is a tape medium.

5. The method of claim 1, wherein the first operation is a search operation, and wherein the method further comprises:
receiving, by the storage system, a search string from the host;
retrieving, by the storage system, a subset of the secondarily compressed records from the storage medium;
decompressing, by the storage system, the subset; and
searching, based on the search string, the decompressed subset.

6. The method of claim 1 further comprising:
encrypting, by the storage system and before the storing, the secondarily compressed records.

7. The method of claim 6 further comprising:
receiving, by the storage system, a request for the encrypted secondarily compressed records;
retrieving, by the storage system, the encrypted secondarily compressed records from the storage medium;
decrypting, by the storage system, the encrypted secondarily compressed records;
decompressing, by the storage system and based on the second compression format, the decrypted secondarily compressed records; and
providing, by the storage system, the requested records.

8. The method of claim 1, wherein the received records are encrypted using a first encryption format native to the host system, and wherein the method further comprises:
decrypting, by the storage system and based on the first encryption format, the received records.

9. The method of claim 1 further comprising:
selecting, by the storage system, a subset of the secondarily compressed records;
decompressing, by the storage system, the selected subset; and
verifying, by the storage system and based on the decompressed subset and based on the received records, the compressing based on the second compression format.

10. The method of claim 9, wherein the verifying is performed before the storing.

11. The method of claim 1, wherein the identified incompatibility is a first compression format that eliminates the uniqueness of character strings, and wherein the first operation is a search based on character strings.

12. A storage system for storing data on a storage medium, the system comprising:
a memory; and
a processor in communication with the memory, wherein the processor is configured to perform a method comprising:
receiving one or more records from a host system, the records compressed in a first compression format native to the host system, wherein the one or more received records are stored in the memory of the storage system and wherein the memory is a separate hardware component from the storage medium;

identifying an incompatibility between the first compression format and a first operation of the storage system such that the storage system is unable to index the one or more records to write them to the storage medium;

decompressing, based on the first compression format and before storage in the storage medium and in response to the identified incompatibility, the received records stored in the memory of the storage system;

compressing, in a second compression format and before storage in the storage medium, the decompressed records; and storing the secondarily compressed records onto the storage medium.

13. The system of claim 12, wherein the method further comprises:

receiving a request for the secondarily compressed records;

retrieving the secondarily compressed records from the storage medium;

decompressing, based on the second compression format, the secondarily compressed records; and providing the requested records.

14. The system of claim 13, wherein the requested records are re-compressed in the first compression format.

15. The system of claim 12, wherein the first operation is a search operation.

16. A computer program product comprising a computer readable storage medium having program instructions embodied therewith, the program instructions executable by a computer to cause the computer to perform a method comprising:

receiving, by a storage system, one or more records from a host system, the records compressed in a first compression format native to the host system;

identifying, by the storage system, an incompatibility between the first compression format and a first operation of the storage system such that the storage system is unable to index the one or more records to write them to the storage medium;

decompressing, by the storage system, based on the first compression format, and in response to the identified incompatibility, the received records;

compressing, by the storage system and in a second compression format, the decompressed records; and storing, by the storage system, the secondarily compressed records onto the storage medium.

17. The computer program product of claim 16, wherein the method further comprises:

encrypting, by the storage system and before the storing, the secondarily compressed records.

18. The computer program product of claim 17, wherein the method further comprises:

receiving, by the storage system, a request for the encrypted secondarily compressed records;

retrieving, by the storage system, the encrypted secondarily compressed records from the storage medium;

decrypting, by the storage system, the encrypted secondarily compressed records;

decompressing, by the storage system and based on the second compression format, the decrypted secondarily compressed records; and providing, by the storage system, the requested records.

19. The computer program product of claim 16, wherein the method further comprises:

selecting, by the storage system, a subset of the secondarily compressed records;

decompressing, by the storage system, the selected subset; and verifying, by the storage system and based on the decompressed subset and based on the received records, the compressing based on the second compression format.

20. The computer program product of claim 19, wherein the verifying is performed before the storing.

* * * * *